(12) United States Patent
Boyd

(10) Patent No.: US 10,334,378 B2
(45) Date of Patent: Jun. 25, 2019

(54) MEMS DEVICE AND PROCESS

(71) Applicant: Cirrus Logic International Semiconductor Ltd., Edinburgh (GB)

(72) Inventor: Euan James Boyd, Edinburgh (GB)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 15/660,431

(22) Filed: Jul. 26, 2017

(65) Prior Publication Data
US 2018/0035228 A1 Feb. 1, 2018

Related U.S. Application Data

(60) Provisional application No. 62/367,946, filed on Jul. 28, 2016.

(30) Foreign Application Priority Data

Oct. 4, 2016 (GB) .................................. 1616858.5

(51) Int. Cl.
*H04R 7/18* (2006.01)
*H04R 19/00* (2006.01)
(Continued)

(52) U.S. Cl.
CPC ......... *H04R 31/006* (2013.01); *B81B 3/0021* (2013.01); *B81B 3/0072* (2013.01);
(Continued)

(58) Field of Classification Search
USPC ..... 381/71.7, 71.8, 150, 162, 174, 372, 395, 381/411, 423
See application file for complete search history.

(56) References Cited

U.S. PATENT DOCUMENTS

2008/0175418 A1 7/2008 Zhang et al.
2011/0048138 A1* 3/2011 Li .................... B81B 3/0086
73/721
(Continued)

FOREIGN PATENT DOCUMENTS

GB 2506173 * 9/2012 ............. H04R 19/00
GB 2506173 A 3/2014
(Continued)

OTHER PUBLICATIONS

Combined Search and Examination Report, United Kingdom Intellectual Property Office, Application No. GB1616858.5, dated Mar. 10, 2017.
(Continued)

*Primary Examiner* — Yosef K Laekemariam
(74) *Attorney, Agent, or Firm* — Jackson Walker L.L.P.

(57) ABSTRACT

The application describes MEMS transducers comprising a flexible membrane layer supported in a fixed relation relative to a substrate along at least one supporting edge, wherein a plurality of slits are provided through the membrane layer. The slits define a plurality of beams. Each beam defines a path between first and second endpoints of the beam, the path comprising at least one change in direction. Also described are transducers wherein the membrane layer is supported in a fixed relation relative to the substrate along a plurality of supporting edges which define a membrane region that is substantially bounded by the supporting edges.

24 Claims, 5 Drawing Sheets

(51) Int. Cl.
- B81B 3/00 (2006.01)
- H04R 19/02 (2006.01)
- H04R 19/04 (2006.01)
- H04R 31/00 (2006.01)

(52) U.S. Cl.
CPC ............ H04R 7/18 (2013.01); H04R 19/005 (2013.01); H04R 19/02 (2013.01); H04R 19/04 (2013.01); *B81B 2201/0257* (2013.01); *B81B 2201/0264* (2013.01); *B81B 2203/0127* (2013.01); *H04R 2201/003* (2013.01); *H04R 2499/11* (2013.01)

(56) References Cited

U.S. PATENT DOCUMENTS

| | | |
|---|---|---|
| 2011/0075866 A1 | 3/2011 | Zhang |
| 2013/0223023 A1 | 8/2013 | Dehe et al. |
| 2015/0014796 A1 | 1/2015 | Dehe |
| 2015/0382091 A1 | 12/2015 | Kim et al. |
| 2017/0281102 A1* | 10/2017 | Ken ............... A61B 6/4258 |

FOREIGN PATENT DOCUMENTS

| | | |
|---|---|---|
| GB | 2537005 A | 10/2016 |
| WO | 03/045110 A1 | 5/2003 |
| WO | 03/068668 A2 | 8/2003 |
| WO | 2006123263 A1 | 11/2006 |

OTHER PUBLICATIONS

Partial International Search Report, International Patent Application No. PCT/GB2017/052054, dated Sep. 27, 2017.

Examination Opinion of the Taiwan Intellectual Property Office, TW Application No. 106124643, dated Aug. 20, 2018.

* cited by examiner

Double Bend

MEMS DEVICE AND PROCESS

FIELD OF DISCLOSURE

This invention relates to a micro-electro-mechanical system (MEMS) device and process, and in particular to a MEMS device and process relating to a transducer, for example a capacitive microphone or speaker.

BACKGROUND

Various MEMS devices are becoming increasingly popular. MEMS transducers, including MEMS capacitive sensors, such as microphones, and capacitive output transducers, such as speakers are increasingly being used in portable electronic devices such as mobile telephones and portable computing devices.

Transducer devices formed using MEMS fabrication processes typically comprise one or more membranes with electrodes for read-out/drive deposited on the membranes and/or a substrate. In the case of MEMS pressure sensors and microphones, for example, the read out is usually accomplished by measuring the capacitance between a pair of electrodes which will vary as the distance between the electrodes changes in response to sound waves incident on the membrane surface.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

In use, in response to a sound wave corresponding to a pressure wave incident on the microphone, the membrane is deformed slightly from its equilibrium position. The distance between the lower electrode 103 and the upper electrode 102 is correspondingly altered, giving rise to a change in capacitance between the two electrodes that is subsequently detected by electronic circuitry (not shown).

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that the etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

The sacrificial material used to define the first and second cavities is dimensioned so as to provide a desired equilibrium separation between the membrane layer 101 and the substrate 105 and also between the membrane layer 101 and the back-plate 104 so as to provide good sensitivity and dynamic range in use. In normal operation the membrane may deform within the volume defined by the first and second cavities without contacting the back-plate and/or substrate 105.

A plurality of holes, hereinafter referred to as bleed holes 111, connect the first cavity 109 and the second cavity 110. The bleed holes allow the pressure in the first and second cavities to equalise over a relatively long timescales (in acoustic frequency terms) which reduces the effect of low frequency pressure variations, e.g. arising from temperature variations and the like, but without significantly impacting on sensitivity at the desired acoustic frequencies.

As mentioned, the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required elasticity whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such instances a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate that may be substantially sealed to provide a back volume. In such instances the substrate cavity 108 is conventionally termed a "front volume".

It should also be noted that whilst FIG. 1 shows the back-plate 104 being supported on the opposite side of the membrane to the substrate 105, arrangements are known where the back-plate 104 is formed closest to the substrate with the membrane layer 101 supported above it.

One skilled in the art will appreciate that MEMS transducers are typically formed on a wafer before being singulated. Increasingly it is proposed that at least some electronic circuitry, e.g. for read-out and/or drive of the transducer, is also provided as part of an integrated circuit with the transducer. For example a MEMS microphone may be formed as an integrated circuit with at least some amplifier circuitry and/or some circuitry for biasing the microphone. The footprint of the area required for the transducer and any circuitry will determine how many devices can be formed on a given wafer and thus impact on the cost of the MEMS device. There is therefore a general desire to reduce the footprint required for fabrication of a MEMS device on a wafer.

A number of membrane designs have been proposed which more efficiently use a generally square or rectangular membrane area rather than a circular area. This beneficially results in a more efficient use of the silicon wafer during fabrication.

In addition, to be suitable for use in portable electronic devices, capacitive transducers should preferably be able to survive the expected handling and use of the portable device, which may include the device being accidentally dropped. If a device such as a mobile telephone is subject to a fall, this can result not only in a mechanical shock due to impact but also a high pressure impulse incident on a MEMS transducer. For example, a mobile telephone may have a sound port for a MEMS microphone on one face of the device. If the device falls onto that face, some air may be compressed by the falling device and forced into the sound port. This may result in a high pressure impulse incident on the transducer. It has been found that in conventional MEMS transducers high pressure impulses can potentially lead to damage of the transducer.

Furthermore, stresses can arise in the membrane layer even when at equilibrium e.g. due to thermal and chemical effects during deposition in manufacture. A certain amount of stress is beneficial in enhancing the elasticity of the membrane and hence the microphone mechanical sensitivity. However additional stresses may occur across the membrane or in particular regions, for example due to the way in which the membrane is supported in a fixed relation relative to the substrate, which can also result in membrane failure or damage. MEMS transducers according to the present invention are intended to respond to the acoustic pressure waves which manifest as transient stress waves on the membrane surface which also provide additional components of stress especially during high pressure impulses. Thus, it will be appreciated that any stresses exhibited within a membrane layer when at equilibrium may potentially have a detrimental impact on the performance or robustness of a transducer.

SUMMARY

Embodiments of the present invention are generally concerned with improving the efficiency and/or performance of a transducer structure. Aspects of the present invention are also concerned with alleviating and/or redistributing stresses within the membrane layer in order to improve the resilience and/or robustness of the transducer. Additionally, or alternatively, aspects of the present invention are concerned with improving the space efficiency of wafer fabrication techniques.

According to a first aspect of the present invention there is provided a MEMS transducer comprising: a flexible membrane layer supported in a fixed relation relative to a substrate along at least one supporting edge, wherein a plurality of slits are provided through the membrane layer between the supporting edge and a central region of the membrane layer, the slits defining a plurality of beams, each beam defining a path between first and second endpoints of the beam, the path comprising at least one change in direction.

Preferably the slits are provided in a region—a stress-release region—of the membrane layer that is between the supporting edge and a central region of the membrane. Thus, the slits can be considered to be provided laterally inside the, or each, supporting edge of the membrane. Preferably, the slits are provided in a region proximate, or adjacent, to the supporting edge. This slit region may be laterally outside the region of the membrane that overlies a substrate cavity. Thus the slits may be formed in a region of the membrane that overlies the transducer substrate. The slits may be formed by a process of etching through the membrane layer.

According to embodiments of the first aspect of the present invention the plurality of slits effectively define a "beam" of membrane material. The sides of the beam are thus substantially defined, or bounded, by a slit which extends through the membrane material. It will be appreciated that the slits may comprise a plurality of slit portions which may be interconnected.

According to embodiments of the first aspect of the present invention, the beam can be considered to define a path which extends between first and second endpoints of the beam, wherein the path comprises at least one "bend" or change in direction. Thus, the path defined by the beam is not straight. The path direction of the beam can be considered to comprise a change in the x and/or y-direction, wherein the plane of the membrane is defined in the xy-plane.

The beams of membrane material can be considered to act as stress relieving structures. Preferably, the beams allow stresses arising within the membrane material to be released by deformation of the beams. Indeed, simulations show a series of stress concentration regions arising along the beams of membrane material defined by an adjacent pair of slits, as well as a series of reduced stress regions just outside the beam of membrane material. Thus, the slits provided through the membrane layer advantageously serve to change the local stress distribution arising within the membrane layer in a controlled way. Controlling the stress in this way advantageously improves the control of elasticity and hence sensitivity of the membrane since, according to some examples, stress is shown to be more evenly distributed at the central region of the membrane. Compliance and/or elasticity of the membrane may thereby be beneficially enhanced.

The provision of a beam which defines a path having at least one change in direction may also enhance the flexibility of the beams, i.e. their ability to flex to relieve stress. It will be appreciated that the bends, or path direction changes, of the beam advantageously allows the length of the beam to be increased without making slits which extend into the region of the membrane that overlies the substrate cavity. The longer effective length of the beam also helps mechanically decouple the membrane from mechanical distortion of the substrate due to manufacturing process or mechanical shocks.

According to preferred embodiments of the present invention the plurality of beams of membrane material defined by the slits advantageously serve to improve the compliance and/or elasticity of the membrane material in the vicinity of the supporting edge.

According to one embodiment the beam defines a path which comprises a first portion that extends in a direction that is generally transverse to the supporting edge and a second portion that extends in a direction that is substantially parallel to the supporting edge. According to one embodiment the beam can be considered to be comprised of at least three portions which are joined together to form a generally S-shaped beam or a Z-shaped beam. According to another embodiment the beam may form a V-shape, or an inverted V-shape (chevron).

Thus, the beam may be comprised of a plurality of generally straight portions or may be comprised of one or more generally curved portions. First and second portions of the beam may be spaced from each other and may extend in a transverse direction with respect to the supporting edge. The first and second portions may be joined by a connecting portion which may extend orthogonally between the first and second portions or at an angle between the first and second portions (e.g. to give a "Z"-shape). The total transverse distance over which the first and second portions extends can be considered to define a length L of the beams. The plurality of bent beams, which may be substantially identical, may be located at regular intervals P along a line that can be defined substantially parallel to the supporting edge.

Whilst the slit will effectively separate a portion of the membrane from the rest of the membrane, the slit is preferably dimensioned such that the portion of the membrane defined by the slit does not act as a flap that deforms due to a pressure differentially across the membrane.

A supporting edge can be considered to comprise a line segment along which the membrane layer is pinned, mounted, or anchored in fixed relation relative to the substrate. Preferably the supporting edges are held in a fixed relation relative to the substrate by means of one or more mount structures, such as a plurality of pillars, which effectively fix or pin the membrane directly or indirectly to the substrate. The mount structures are thus preferably configured to define a supporting edge.

The location of the supporting edge thus effectively defines a boundary within the membrane layer. This boundary will become a boundary of a main membrane region of the transducer. The main membrane region may be considered to be the "active" membrane region of the transducer i.e. the region of the transducer membrane layer that is used for sensing and/or is dynamic. For example, in the case of a microphone device comprising a MEMS transducer according to an embodiment of an aspect of the present invention, the active membrane region is the region of the membrane layer that is able to respond i.e. deflect—in response to an acoustic stimulus.

Thus, the shape of the membrane region may be at least partially defined by the boundary formed by the supporting, or fixed, edge(s). It is therefore envisaged that the main/active membrane region may be defined within the footprint of a larger deposited membrane layer.

The membrane region may also be bounded by one or more other edges which are unsupported and can therefore be considered to be "free" or "unfixed" edges of the membrane. The unfixed edges are potentially able to move relative to the substrate as the flexible membrane deflects in response to an acoustic pressure differential across the membrane. The unfixed edges may e.g. be defined by the edge of the deposited membrane layer. Additionally or alternatively an unfixed portion may be provided between adjacent supporting edges.

According to embodiments of the present invention the plurality of slits preferably do not intersect any edge of the membrane region and are thus provided entirely within the membrane region.

The main or active membrane region may be generally circular in shape. The, or each of the, supporting edges may define a membrane region that is generally circular in shape. The circular membrane region may be defined by a single supporting edge such that the membrane region in secured around substantially the entire periphery of the membrane region without any unfixed portions. The provision of a plurality of slits/beams advantageously serves to redistribute and/or release stresses arising within the membrane layer in the vicinity of the periphery of the membrane region and/or improve the flexibility and/or elasticity and thus robustness of such a circular design, which also offers good performance characteristics.

Alternatively, the circular membrane region may be defined by a plurality of supporting edges having at least one unfixed portion interposed between adjacent supporting edges. The extent of the unfixed region or regions may be relatively small such that the membrane is still secured around almost/substantially the entire periphery. The benefit of this arrangement is that the membrane region is still held in position around substantially the whole perimeter which enables stresses within the membrane layer to be evenly distributed and, thus, means that the resultant transducer exhibits a good level of robustness whilst the unfixed portions further enhance the flexibility and, thus, the capability of the membrane to withstand stress.

The supporting edges form the boundary edges of the membrane region which may be generally square or rectangular in shape. Thus, the membrane layer is fixed to the substrate along substantially the whole length of the boundary edges. Thus, almost the entire boundary of the membrane region is fixed to the substrate. However one or more unfixed portion of the membrane layer may be provided along the boundary. Thus, the membrane layer may comprise at least one unfixed portion provided between adjacent supporting edges.

Transducer configurations according to the first aspect of the present invention which comprise a membrane having a generally square or rectangular shape will benefit from a more efficient use of the silicon wafer during fabrication. Furthermore, the feature of the boundary edges of the membrane region being fixed advantageously serves to evenly distribute stresses arising in the membrane layer, whilst the plurality of slits—which define a plurality of bent bends—results in an embodiment with enhanced elasticity and or compliance of the membrane.

According to a second aspect of the present invention there is provided a MEMS transducer comprising: a flexible membrane layer and a substrate, wherein the membrane layer is supported in a fixed relation relative to the substrate along a plurality of supporting edges which define a membrane region substantially bounded by the supporting edges.

The membrane layer may further comprise at least one unfixed portion provided between adjacent supporting edges. The adjacent supporting edges are provided substantially orthogonally, or at least transversally, to each other such that a line can be drawn coincident with one said adjacent supporting edges which will intersect a line drawn coincident with the other said adjacent supporting edge at a vertex, wherein the unfixed portion is provided at or near said vertex.

Thus, although the membrane region is substantially bounded by the supporting edges, it will be appreciated that the supporting edges need not form a complete unbroken boundary around the membrane region. Rather, the membrane layer may be unfixed relative to the substrate at one or more unfixed portions which are provided between adjacent supporting edges. Preferably, the unfixed portions are relatively small such that at least 75%, preferably at least 85% and even more preferably at least 90% of the length of the entire boundary of the membrane region is supported in a fixed relation relative to the substrate.

The benefit of this arrangement is that the membrane region is held in position around substantially the whole perimeter of the region which enables stresses within the membrane layer to be more evenly distributed along the supporting edges and, thus, means that the resultant transducer exhibits a good level of robustness. The provision of one or more, relatively small, unfixed portions serves to allow the membrane to move more freely. As a result, according to preferred embodiments which provide one or more unfixed portions, it is possible to achieve an increase in the capacitance change demonstrated by the transducer for a given pressure differential.

The unfixed portions also allow membrane stress concentrations which might otherwise arise near the vertices of the membrane region to be relieved, as the unfixed portions of the membrane perimeter are more freely to distort than even the portions of the perimeter that are flexibly supported by the beams.

Preferably the membrane layer comprises four supporting edges and four vertices, the supporting edges defining a membrane region having a generally square or rectangular shape, and wherein an unfixed portion is provided at each of the vertices.

Preferably, a plurality of slits are provided in the membrane region, said slits defining a plurality of beams. Preferably the slits are provided in the region of the membrane that is between the supporting edge and a central region of the membrane layer. Preferably, the slits are provided in a region close, or adjacent, to the supporting edge. This slit region may be laterally outside the region of the membrane that overlies the substrate cavity. Thus the slits may be formed in a region of the membrane that overlies the transducer substrate.

Again, the slits effectively define a "beam" of membrane material that extends between a pair of slits (or a pair of channels formed of a plurality of interconnecting slits). According to embodiments of the second aspect of the present invention, the beams may define a path that is straight. Thus the beams may define a path that extends in only a first direction e.g. a direction that is transverse to the supporting edge. The slits defining the straight beams may be curved or arcuate in form. Thus, the slits may be C-shaped or U-shaped and may curve through at least 180 degrees to define a mouth, or opening, between the ends of the slit. Thus, a straight beam is formed between adjacent prongs of adjacent U-shaped slit. Preferably the mouth of the curved slit faces away from the boundary defined by the supporting edge and is separated from the region of the mount structure by the slit.

Whilst the slit will effectively separate a portion of the membrane from the rest of the membrane, the slit is preferably dimensioned such that the portion of the membrane defined by the slit does not act as a flap that deforms due to a pressure differentially across the membrane. Thus, the portion within the bounding curve of the slit may exhibit minimal deflection away from the plane of the membrane in response to a differential pressure across the membrane.

Alternatively, the beam may define a path which extends between first and second endpoints of the beam, wherein the path comprises at least one "bend" or change in direction. Thus, according to an embodiment of the second aspect the path defined by the beam is not straight. The path direction of the beam can be considered to comprise a change in the x and/or y-direction, wherein the plane of the membrane is defined in the xy-plane.

Thus, according to embodiments of the second aspect of the present invention, the overall shape of the membrane region, which may be an active membrane region, is bound/defined by the plurality of supporting, or fixed, edges. Each supporting edge therefore represents a line along which the membrane layer is fixed relative to the substrate and, thus, forms a boundary of the membrane region.

A generally square or rectangular shaped membrane region, for example, will thus be formed of at least four, longitudinal supporting edges. A supporting edge can be considered to comprise a line segment along which the membrane layer is pinned, mounted, or anchored in fixed relation relative to the substrate.

A square/rectangular membrane region may also comprise boundary edges other than four longitudinal edges. For example, consider a square shaped membrane region which has been truncated at one or more of the corners to provide a facet in place of the vertex. A fully truncated square will have 8 edges. The membrane may exhibit so-called shallow truncation such that 4 longer edges extend between the shorter truncated edges. Preferably, the longer edges are supporting edges of the present invention and are thus, supported in fixed relation relative to the substrate. The truncated edges may comprise unfixed edges, particularly if the truncation is relatively shallow. Alternatively the truncated edges may also be pinned relative to the substrate.

Transducer configurations according to embodiments of the second aspect of the present invention which comprise a membrane having a generally square or rectangular shape will benefit from a more efficient use of the silicon wafer during fabrication.

The transducer may comprise a back-plate structure wherein the flexible membrane layer is supported with respect to the back-plate structure. The back-plate structure may comprise a plurality of holes which extend through the back-plate structure.

The transducer may be a capacitive sensor such as a microphone or may be a speaker. Thus, the MEMS transducer may further comprise an electrode coupled to the main/active membrane region. The transducer may comprise readout, i.e. amplification, circuitry. The transducer may be located within a package having a sound port, i.e. an acoustic port. The transducer may be implemented in an electronic device which may be at least one of: a portable device; a battery powered device; an audio device; a computing device; a communications device; a personal media player; a mobile telephone; a tablet device; a games device; and a voice controlled device.

According to another aspect there is provided a wafer comprising at least one transducer embodying any aspect of the present invention. Preferably the wafer is a silicon wafer and comprises a transducer area where transducers are provided on the wafer. It is typical for the transducer area of a silicon wafer to be square or rectangular in shape. Thus, embodiments of the present invention which provide a membrane area having a generally square or rectangular shape are particularly advantageous when fabricating a silicon wafer having one or more MEMS transducers, since it will be appreciated that such a design requires less area for a given transducer sensitivity than an equivalent circular design.

Features of any given aspect may be combined with the features of any other aspect and the various features described herein may be implemented in any combination in a given embodiment.

Associated methods of fabricating a MEMS transducer are provided for each of the above aspects.

BRIEF DESCRIPTION OF THE DRAWINGS

For a better understanding of the present invention and to show how the same may be carried into effect, reference will now be made by way of example to the accompanying drawings in which.

Throughout this description any features which are similar to features in other figures have been given the same reference numerals.

DESCRIPTION

It will be appreciated that the membrane layer of a MEMS transducer experiences stresses. A material is said to be under stress when its atoms are displaced from their equilibrium positions due to the action of a force. Thus, a force that increases or decreases the interatomic distance between the atoms of the membrane layer gives rise to stress within the membrane. For example, the membrane layer exhibits an inherent, or intrinsic, residual stress when at equilibrium (i.e. when no or negligible differential pressure arises across the membrane). Furthermore, additional stresses can arise in the membrane layer e.g. due to the way in which the membrane is supported in a fixed relation to the substrate or due to an acoustic pressure wave incident on the membrane.

Figure 2:
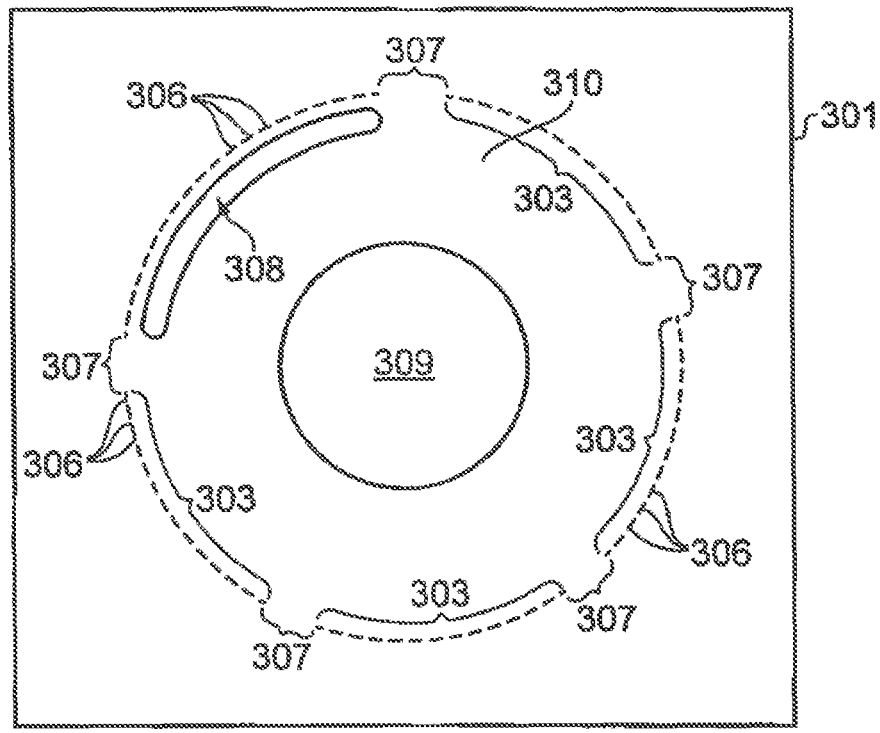
FIG. 2 illustrates a membrane of a transducer structure according to a first example embodiment.

FIG. 2 illustrates an embodiment of a first aspect of the present invention. As shown in FIG. 2 a flexible membrane layer 301 is supported in a fixed relation relative to a substrate by means of a plurality of mount structures 306. The arrangement of the mount structures effectively define a circular membrane region 310 which can be considered to be bound by a plurality of supporting edges 303. A plurality of unbound portions 307 are provided between adjacent supporting edges 303. In this particular example the circular membrane region is defined within a larger membrane layer.

However, a membrane region having a similar configuration can be provided using a circular membrane layer that is pinned at the periphery.

According to an embodiment of the present invention a plurality of slits 311 (not shown) are provided through the membrane layer between the supporting edge and a central region of the membrane layer. The slit region, also known as a stress release region, is denoted in FIG. 2 by the region 308. It will be appreciated that a region 308 will be similarly provided adjacent to each of the supporting edges 303. The slits can thus be considered to be provided laterally inside the supporting edges of the membrane in a region close, or adjacent, to the supporting edge. This slit region may preferably be laterally outside the region of the membrane that overlies the substrate cavity 309. Thus the slits may be formed in a region of the membrane that overlies the transducer substrate. The slits may be formed by a process of etching through the membrane layer. Providing the slits in a region of the membrane that overlies the transducer substrate gives rise to a relatively narrow channel extending laterally across a part of the first cavity from the substrate cavity to at least most of each of the slits. This relatively tortuous path provides an acoustic impedance which attenuates any leakage airflow that might otherwise occur through the slits, bypassing the main region of the membrane and degrading the sensitivity. Also the beam structures themselves are advantageously physically shielded from high pressure impulses that might otherwise tend to damage them.

Figure 3A:
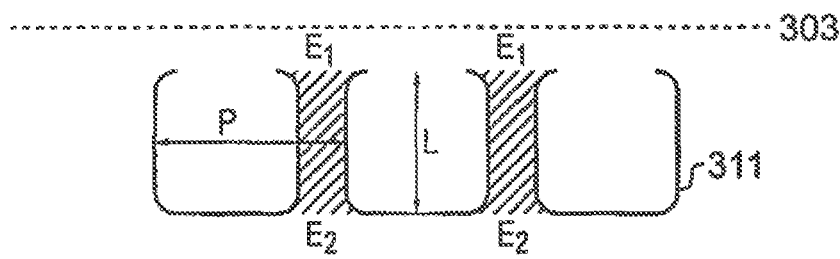
FIGS. 3a to 3d illustrate various slit configurations forming a plurality of beams of membrane material.
Figure 3B:
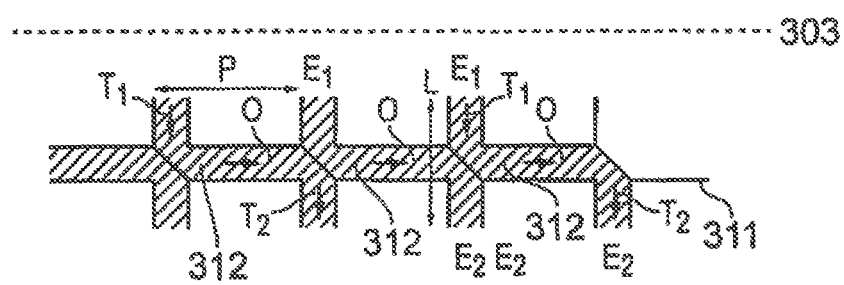
Figure 3C:
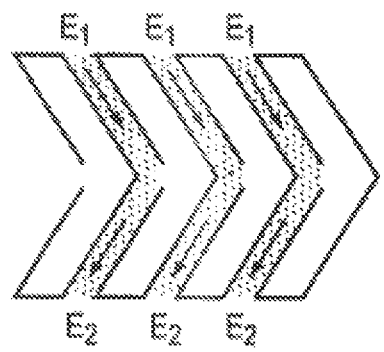
Figure 3D:
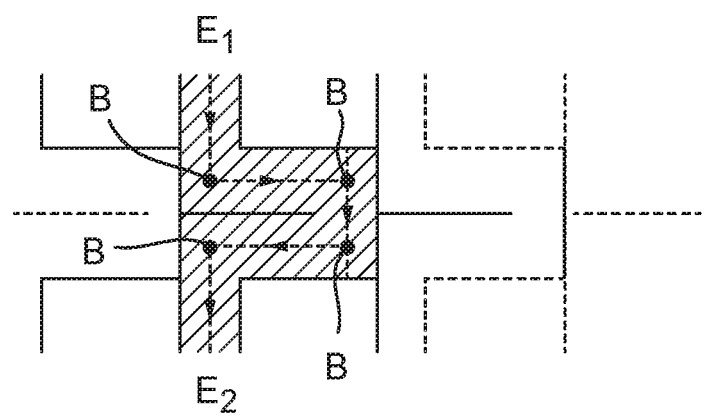

Several configurations of the slits 311 are illustrated in FIGS. 3b to 3d which each show an expanded view of a portion of the membrane layer. The provision of a plurality of slits 311 through the membrane forms a plurality of "beams" 312 of membrane material that extends between a pair of slits (or a pair of channels formed of a plurality of interconnecting slits). The slits are typically less than 1 μm wide. The beams may be considered to form stress-release structures which are integrally formed within the membrane layer.

FIG. 3a shows slit formations which are generally U-shaped.

FIG. 3b shows a slit formation according a preferred example embodiment of the present invention. The plurality of slits 311 form a plurality of beams of membrane material 312, each beam defining a path between first and second endpoints E1 and E2 and comprising two "bends" or changes in direction.

According to the FIG. 3b example, the beam 312 defines a path that is not straight and thus includes at least one "bend". As shown in FIG. 3b the beam defines a path comprising a first transverse portion which extends in a direction $T_1$ that is transverse to the supporting edge, a second transverse portion that extends in a direction $T_2$ that is substantially parallel to the first transverse portion, and a third, connecting, portion that extends in a direction θ that is substantially parallel to the supporting edge or orthogonal to the first and second transverse portions. According to an alternative embodiment, the connecting portion may extend at an angle between the first and second portions (e.g. to give a "Z"-shape). It will be appreciated that the bends or changes in direction between the different portions of the beam may be generally rounded and/or the beam may comprise a S-shape in which the path is curved and the path direction changes over the whole length of the beam.

The total transverse distance over which the first and second portions extends can be considered to define a length L of the beams. The plurality of beams, which in this embodiment are substantially identical, are located at regular intervals along a line that can be defined substantially parallel to the supporting edge 303. An interval distance P extends between corresponding portions of adjacent beams.

The slits provided through the membrane layer advantageously serve to change and/or release the local stress distribution arising within the membrane layer in a controlled way. Controlling the stress in this way advantageously improves the control of sensitivity of the membrane since, according to some examples, stress is shown to be more evenly distributed at the central region of the membrane. Compliance and/or elasticity of the membrane may be thereby beneficially enhanced.

It will be appreciated that numerous slit arrangements are envisaged within the scope of the present invention which result in the formation of a plurality of beams which define a path with at least one change in direction. FIGS. 3c and 3d show further slit formations according example embodiments of the present invention.

FIG. 3c illustrates a further arrangement of a plurality of slits which are etched into the flexible membrane layer at the slit, or stress-release, region to form a plurality of V-shaped or "chevron" beams. The beams define a path having a notional direction as indicated by the arrows and comprising one change in direction between endpoints $E_1$ and $E_2$. Each beam is formed between a pair of adjacent slits whilst the endpoints of the beam are directly connected with the rest of the membrane. Thus, this example provides a relatively shallow bend compared to the length of the beam. (The dark line indicate the etch within the membrane layer)

It will be appreciated that each bend, or change of direction, within the beam may advantageously increase the flexibility of the beam structure. FIG. 3d shows a beam structure which can be considered to follow a straight-line path direction as indicated by the arrows. It can be seen that the straight-line path comprises four bends B, or changes in direction.

Figure 1A:
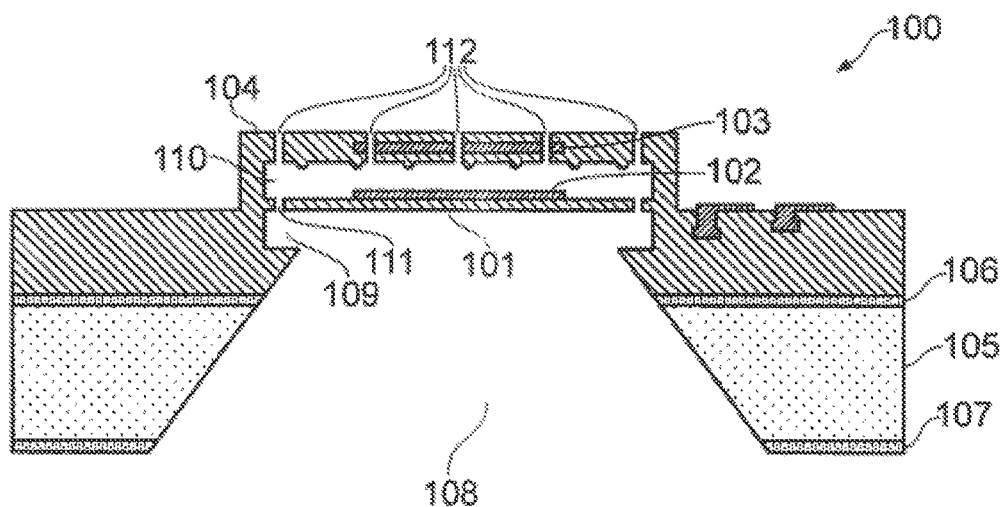
FIGS. 1a and 1b illustrate sectional and perspective views of a known MEMS microphone structure.
Figure 1B:
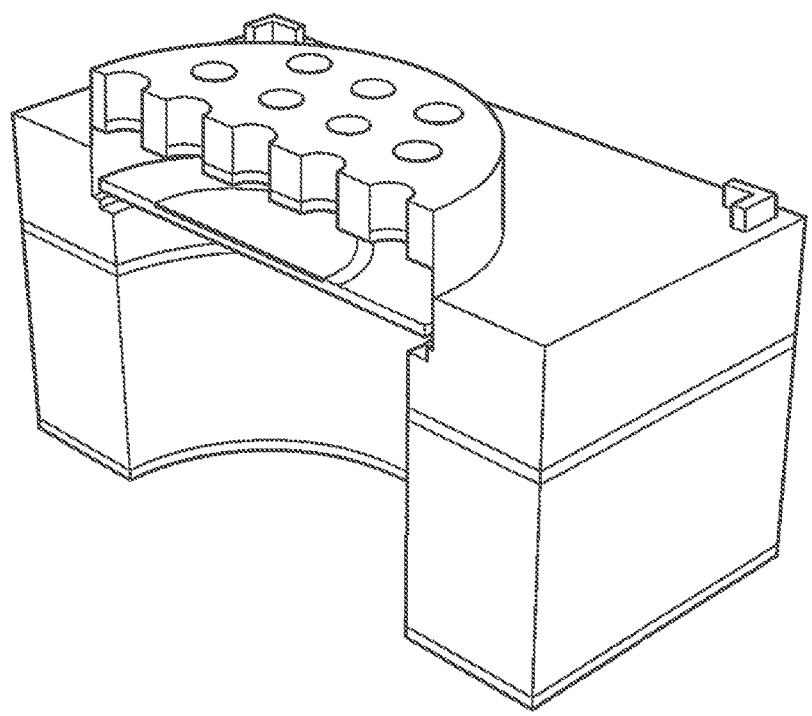

In transducers such as described above in relation to FIGS. 1a and 1b the membrane layer be formed from a material such as silicon nitride and may be deposited to be have residual stress inherent in the membrane at equilibrium. The membrane is formed so as to be supported around substantially the whole of its periphery. The membrane can therefore be thought of as being under tension, akin to a drum skin stretched over a frame. To provide uniform behaviour and even stress distribution the membrane is thus typically formed as a generally circular structure.

For various reasons it is most usual and/or cost effective to process areas of silicon in generally rectangular blocks of area. Thus the area on a silicon wafer that is designated for each MEMS transducer is typically generally square or rectangular in shape. This area needs to be large enough to encompass the generally circular transducer structure. This tends to be inefficient in terms of use of the silicon wafer as the corner regions of this designated transducer area are effectively unused. This limits the number of transducer structures and circuits that can be fabricated on a given wafer. It would of course be possible to fit more transducers on a wafer by reducing the size of the transducer but this would have any impact on resulting sensitivity and thus is undesirable.

Whilst a substantially circular membrane often exhibits good device properties the use of circular membranes tends to result in some inefficiency in the use of the silicon wafer.

Figure 4:
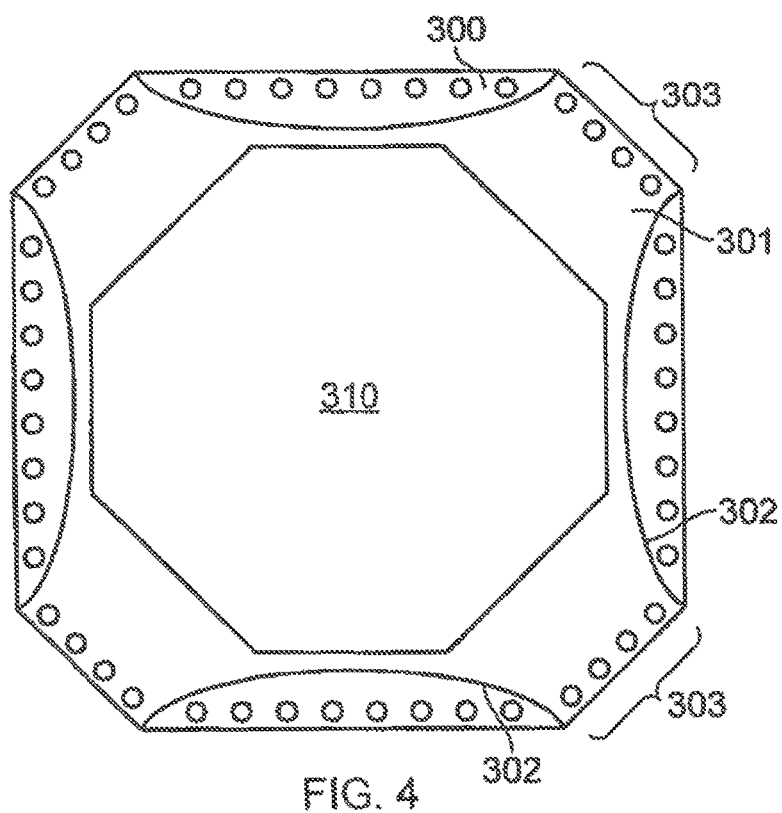
FIG. 4 illustrates a membrane of a previously considered transducer structure.

Transducer designs have therefore been proposed which are based on a membrane having a generally rectangular or square area. FIG. 4 shows a previously considered transducer having a membrane layer 300 which exhibits a truncated square shape. The membrane layer is provided with channels 302 which define a main membrane region 301. The main membrane region is bound by four supporting edges 303 which are provided along the truncated edges of the membrane layer. Along these edges a series of mounts 306 support the membrane layer 301 in a fixed relation relative to the underlying substrate. The membrane region 301 is also bound by unfixed edges formed by the channels 301. The substrate is provided with a cavity 310 which underlies a central portion of the membrane region 301. The membrane region 301 thus forms an active region of the membrane that is used for sensing.

Although the FIG. 4 design offers clear benefits in terms of more efficient use of the silicon wafer during fabrication, there is still a desire to improve the overall robustness and/or performance of the transducer.

Figure 5:
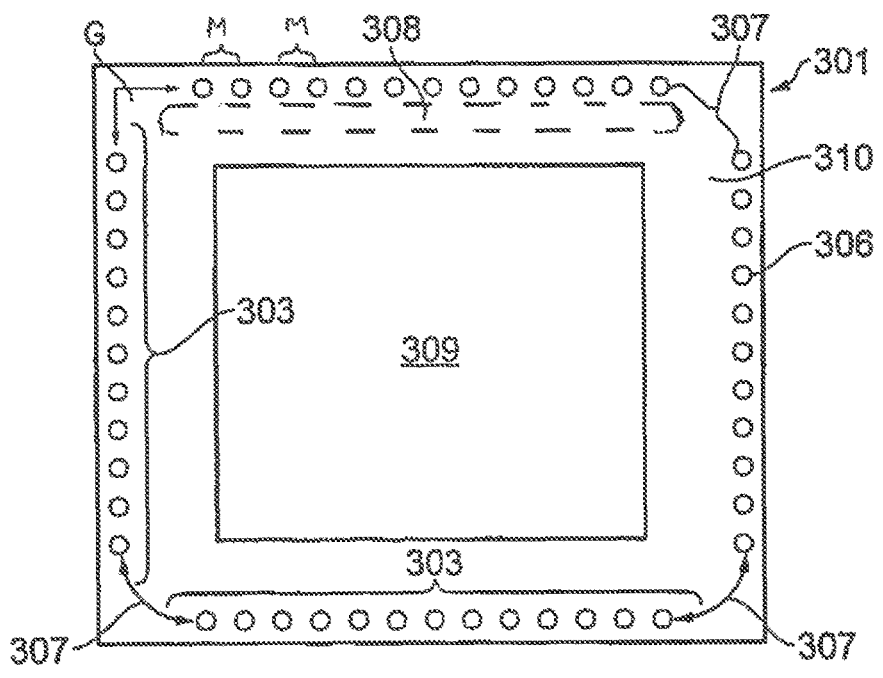
FIG. 5 illustrates a membrane of a transducer structure according to a second embodiment.

FIG. 5 shows a membrane of a transducer according to a second example embodiment of the present invention. The membrane layer 301, which is generally square-shaped, is supported in a fixed relation relative to an underlying substrate by means of a plurality of mount structures 306. The mount structures are provided along substantially the entire length of each of the sides of the membrane layer. Thus, in this example, the membrane layer comprises four supporting edges 303. The membrane layer is provided with a plurality of slits 401 which are provided in regions 308 provided adjacent to each of the supporting edges. The pattern of slits is formed by a process of etching through the membrane layer. The slit region 308 is laterally outside the region of the membrane that overlies the substrate cavity 309. Thus the slits are formed in a region of the membrane that overlies the transducer substrate.

According to this embodiment the membrane layer is supported in a fixed relation relative to the substrate along the plurality of supporting edges 303 which define a membrane region 310 that substantially bounded by the supporting edges. Pairs of adjacent supporting edges coincide at a vertex in the sense that a line can be drawn coincident with each supporting edge which when extrapolated will intersect a similarly extrapolated line drawn coincident with an adjacent supporting edge.

In this example the membrane layer at the region of the vertex is not supported in a fixed relation relative to the substrate. Thus, the membrane-layer comprises four unfixed portions 307 which are provided between adjacent supporting edges. The mount structures are provided regularly along the lengths of the sides of the membrane region at an interval M. It can be seen that the interval distance between the end mount structure on one supporting edge and the end mount structure on an adjacent supporting edge is larger than M. Thus, the interval M is broken at the corners of the membrane and a gap is provided between adjacent mount structures which gives rise to an interval G between adjacent mount structures at the corners, where G may be for example between 1.5 and 10 times M (G=1.5M-10M). The gap is therefore relatively small compared to the length of the supporting edges.

Thus, the membrane is pinned along almost the entire perimeter of the main membrane region. Within the context of the present invention "substantially bounded" should be interpreted as requiring that the membrane region is supported in a fixed relation relative to the substrate along at least 75% of the perimeter of the membrane region. This is determined by the extent of the unbound portion on the perimeter.

Thus, although the membrane region is substantially bounded by the supporting edges, it will be appreciated that the supporting edges need not form a complete unbroken boundary around the membrane region. Rather, the membrane layer may be unfixed relative to the substrate at one or more unfixed portions which are provided between adjacent supporting edges. Preferably, the unfixed portions are relatively small such that at least 75%, preferably at least 85% and even more preferably at least 90% of the length of the entire boundary of the membrane is supported in a fixed relation relative to the substrate.

The benefit of this arrangement is that the membrane region is held in position around substantially the whole perimeter which enables stresses within the membrane layer to be more evenly distributed, rather than concentrated in particular regions. Thus any stress superimposed on this quiescent stress due to pressure waves or impulses or mechanical shock is less likely to result in a destructive level of stress at any particular region and, thus means that the resultant transducer exhibits a good level of robustness. The absence of the supporting edges near the corners of the structure may avoid "pin-cushion" stress concentrations at the corners. The provision of one or more, relatively small, unfixed portions thus serves to further enhance the robustness of the transducer membrane.

The membrane layer shown in FIG. 5 is provided with a plurality of slits 401 which are provided in regions 308 provided adjacent to each of the supporting edges. A variety of slit patterns are envisage which define either straight or non-straight beams. Thus, the pattern of slits may take the form of the arrangement shown in FIG. 3a. Alternatively the pattern of slits may take the form of the arrangements shown in FIGS. 3b, 3c and 3d previously discussed above.

Figure 6:
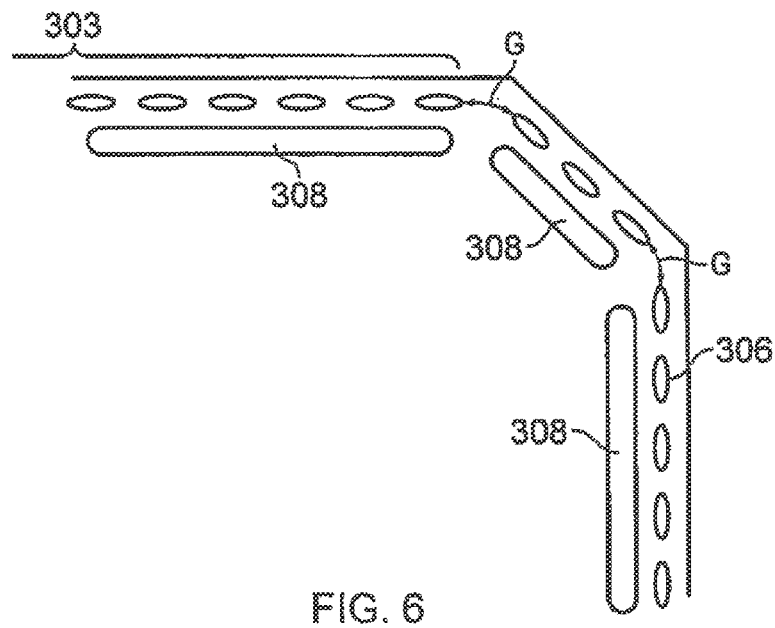
FIG. 6 illustrates a section of a membrane according to a third example embodiment.

FIG. 6 shows a section of a membrane layer according to a further example embodiment of the present invention. In this example, the membrane layer comprises a truncated square. Mounts 306 are provided along the main edges of the square as well as along the truncated edges. Depending on the degree of truncation, and thus the length of the truncated edge, it is also envisaged within the context of the present invention that the truncated edge may be an unfixed edge.

It will be appreciated that the mounts 303 may take various forms. For instance the mount could comprise a sidewall of the transducer structure and the membrane layer may extend into the sidewall. In some examples however the mount may be region where the membrane material makes contact with the substrate or a support structure that rises from the substrate. The mount may also comprise an area where the backplate are a support structure for the backplate makes contact with the membrane. The membrane at the mount is thus effectively held in place and prevented from any substantial movement with respect to the substrate and/or backplate.

Figure 7:
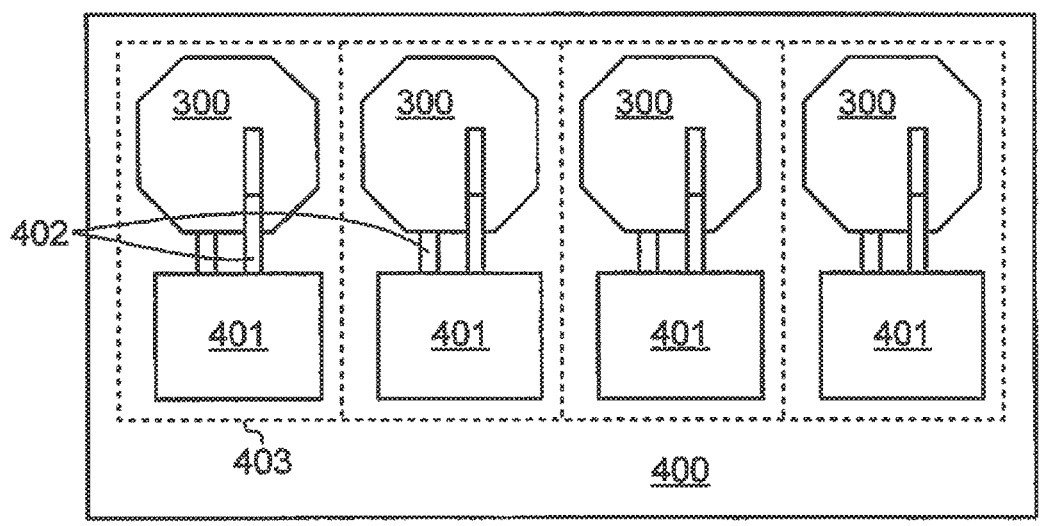
FIG. 7 illustrates the formation of multiple transducers on a wafer.

FIG. 7 illustrates at least part of a wafer 400 having a plurality of transducers 300 fabricated thereon. The wafer may 400 may be a wafer that has been processed to produce multiple devices and prior to singulation. In this example each transducer has associated region of circuitry 401. The region of circuitry may comprise circuitry for operation and/or readout of the transducer. For instance the circuitry may comprise a voltage biasing circuit such as a charge pump. Additionally or alternatively the readout circuitry may comprise amplifier circuitry such as a low noise amplifier or other readout or signal processing circuitry. The transducer 300 will be connected to the circuitry by conductive paths 402, which may typically be at least partly buried under various other layers such as passivation layers. The circuitry area may include contact regions for making electrical connections in use.

It can be seen that the transducer 300 and circuitry 401 fit into a rectangular fabrication area 403 and thus make effective use of the fabrication area. Thus the area of a wafer may be used more efficiently, i.e. to produce a greater number of transducers than would otherwise have been the case using a circular transducer design but without any significant loss in active membrane area and hence reduction of sensitivity of the resulting transducers.

It should be understood that the directions provided should not be in any way construed as limiting to any particular orientation of the transducer during any fabrication step and/or it orientation in any package, or indeed the orientation of the package in any apparatus. The relative terms "upper", "lower", "above", "below", "underside", "underneath" etc. shall be construed accordingly.

The first cavity and substrate cavity may be formed in any known way. Advantageously the cavity may have a cross sectional area that increases towards the lower side of the substrate. Thus the first cavity immediately underlying the transducer may have a first cross sectional area so that the area of the membrane is defined accurately. Towards the lower side of the die substrate the cross sectional area of the substrate cavity may be larger so as to maximise the part of the back volume provided by the substrate cavity. In some embodiments there may be a step change in the slope profile of the walls of the substrate cavity. Such a cavity profile may be achieved by a multi-stage etching process such as described in the patent GB2451909.

Embodiments of the present invention are particularly applicable to MEMS sensor transducers, especially capacitive transducers such as MEMS microphones and MEMS speakers. It will also be appreciated that other types of MEMS capacitive sensors could be implemented, for example accelerometers, pressure sensors, proximity sensors or flow meters.

Embodiments may be implemented in a host device, especially a portable and/or battery powered host device such as a mobile telephone, and audio player, a video player, a PDA, a mobile computing platform such as a laptop computer or tablet and/or a games device for example or in an accessory device, such a headset, earbud (possibly noise-cancelling), or microphone assembly, designed for wired, or wireless connection with such host devices, possibly via multi-wire cables, multi-pole jacks, or optical fibres and connectors.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A MEMS transducer comprising:
a flexible membrane layer supported in a fixed relation relative to a substrate along at least one supporting edge, wherein a plurality of slits are provided through the membrane layer between the supporting edge and a central region of the membrane layer, the slits defining a plurality of beams, each beam defining a path between first and second endpoints of the beam, the path comprising at least one change in direction, wherein each beam comprises a first transverse portion that extends in a first direction that is transverse to the supporting edge, a second transverse portion that extends in a direction substantially parallel to said first direction and a connecting portion which extends between the first and second transverse portions.

2. A MEMS transducer as claimed in claim 1, wherein the plurality of slits are provided in a stress-release region which is laterally outside the region of the membrane that overlies a cavity of the substrate.

3. A MEMS transducer as claimed in claim 1, wherein the connecting portion extends substantially orthogonally between the first and second transverse portions.

4. A MEMS transducer as claimed in claim 1, wherein the beams are generally S-shaped or Z-shaped.

5. A MEMS transducer as claimed in claim 1, wherein the plurality of beams are located at regular intervals along a line that can be defined substantially parallel to the supporting edge.

6. A MEMS transducer as claimed in claim 1, wherein the plurality of beams are substantially identical.

7. A MEMS transducer comprising:
a flexible membrane layer supported in a fixed relation relative to a substrate along at least one supporting edge, wherein a plurality of slits are provided through the membrane layer between the supporting edge and a central region of the membrane layer, the slits defining a plurality of beams, each beam defining a path between first and second endpoints of the beam, the path comprising at least one change in direction, and wherein the, or each of the, supporting edges define a membrane region that is generally circular in shape.

8. A MEMS transducer as claimed in claim 1, comprising a plurality of supporting edges, wherein the supporting edges define a membrane region of the membrane layer that is substantially bounded by the supporting edges.

9. A MEMS transducer as claimed in claim 8, wherein the membrane region of the membrane layer is generally square or rectangular in shape.

10. A MEMS transducer as claimed in claim 8, wherein the membrane region is bound by a plurality of boundary edges, each boundary edge being formed of a supporting edge of the membrane along which the membrane is supported in a fixed relation relative to the substrate.

11. A MEMS transducer comprising:
a flexible membrane layer and a substrate, wherein the membrane layer is supported in a fixed relation relative to the substrate along a plurality of supporting edges which define a membrane region substantially bounded by the supporting edges, the membrane layer further comprising at least one unfixed portion provided between a first supporting edge and an adjacent second supporting edge, wherein the adjacent supporting edges are provided such that a line can be drawn coincident with said first adjacent supporting edge which will intersect a line drawn coincident with said second adjacent supporting edge at a vertex, the unfixed portion being provided at or near said vertex.

12. A MEMS transducer as claimed in claim 11, wherein the membrane layer comprises four supporting edges and four vertices, the supporting edges defining a membrane region having a generally square or rectangular shape, and wherein an unfixed portion is provided at each of the vertices.

13. A MEMS transducer as claimed in claim 11, wherein a plurality of slits are provided in the membrane region, said slits defining a plurality of beams.

14. A MEMS transducer as claimed in claim 13, wherein the plurality of slits are provided in a stress-release region which is laterally outside the region of the membrane that overlies a cavity of the substrate.

15. A MEMS transducer as claimed in claim 13, wherein each beam defines a substantially straight path that extends in a direction that is transverse to the supporting edge.

16. A MEMS transducer as claimed in claim 13, wherein each beam defines a path between first and second endpoints of the beam, the path comprising at least one change in direction.

17. A MEMS transducer as claimed in claim 1, wherein the membrane layer comprises a crystalline or polycrystalline material.

18. A MEMS transducer as claimed in claim 1 wherein said transducer comprises a capacitive sensor such as a capacitive microphone.

19. A MEMS transducer as claimed in claim 18 further comprising readout circuitry, wherein the readout circuitry may comprise analogue and/or digital circuitry.

20. An electronic device comprising a MEMS transducer as claimed in claim 1, wherein said device is at least one of: a portable device; a battery powered device; an audio device; a computing device; a communications device; a personal media player; a mobile telephone; a games device; and a voice controlled device.

21. An integrated circuit comprising a MEMS transducer as claimed in claim 1 and readout circuitry.

22. A MEMS transducer as claimed in claim 7, comprising a plurality of supporting edges, wherein the supporting edges define a membrane region of the membrane layer that is substantially bounded by the supporting edges.

23. A MEMS transducer as claimed in claim 22, wherein the membrane region of the membrane layer is generally square or rectangular in shape.

24. A MEMS transducer as claimed in claim 22, wherein the membrane region is bound by a plurality of boundary edges, each boundary edge being formed of a supporting edge of the membrane along which the membrane is supported in a fixed relation relative to the substrate.

* * * * *

UNITED STATES PATENT AND TRADEMARK OFFICE
CERTIFICATE OF CORRECTION

PATENT NO. : 10,334,378 B2
APPLICATION NO. : 15/660431
DATED : June 25, 2019
INVENTOR(S) : Euan James Boyd Page 1 of 1

It is certified that error appears in the above-identified patent and that said Letters Patent is hereby corrected as shown below:

In the Specification

1. In Column 6, Line 55, delete "and or" and insert -- and/or --, therefor.

2. In Column 9, Line 38, delete "DESCRIPTION" and insert -- DETAILED DESCRIPTION --, therefor.

3. In Column 11, Line 26, delete "layer)" and insert -- layer). --, therefor.

4. In Column 12, Lines 5-6, delete "channels 301." and insert -- channels 302. --, therefor.

5. In Column 12, Line 6, delete "cavity 310" and insert -- cavity 309 --, therefor.

6. In Column 13, Line 37, delete "mounts 303" and insert -- mounts 306 --, therefor.

Signed and Sealed this
Twenty-ninth Day of October, 2019

Andrei Iancu
*Director of the United States Patent and Trademark Office*